US012753122B2

(12) United States Patent
Hirose et al.

(10) Patent No.: US 12,753,122 B2
(45) Date of Patent: Oct. 6, 2026

(54) LEAD-FREE PIEZOELECTRIC CERAMIC COMPOSITION AND PIEZOELECTRIC ELEMENT

(71) Applicant: Niterra Co., Ltd., Nagoya (JP)

(72) Inventors: Yoshinobu Hirose, Nagoya (JP); Takayuki Matsuoka, Nagoya (JP); Kentaro Ichihashi, Nagoya (JP); Masato Yamazaki, Nagoya (JP)

(73) Assignee: Niterra Co., Ltd., Nagoya (JP)

( * ) Notice: Subject to any disclaimer, the term of this patent is extended or adjusted under 35 U.S.C. 154(b) by 688 days.

(21) Appl. No.: 18/272,971

(22) PCT Filed: Apr. 1, 2022

(86) PCT No.: PCT/JP2022/016992

§ 371 (c)(1),
(2) Date: Jul. 18, 2023

(87) PCT Pub. No.: WO2022/215666

PCT Pub. Date: Oct. 13, 2022

(65) Prior Publication Data

US 2024/0308917 A1 Sep. 19, 2024

(30) Foreign Application Priority Data

Apr. 8, 2021 (JP) ................................. 2021-065980

(51) Int. Cl.
*C04B 35/495* (2006.01)
*H10N 30/853* (2023.01)
*H10N 30/87* (2023.01)

(52) U.S. Cl.
CPC ......... *C04B 35/495* (2013.01); *H10N 30/853* (2023.02); *H10N 30/87* (2023.02);
(Continued)

(58) Field of Classification Search
None
See application file for complete search history.

(56) References Cited

U.S. PATENT DOCUMENTS

2012/0146462 A1 6/2012 Yamazaki et al.
2014/0139070 A1 5/2014 Yamazaki et al.
(Continued)

FOREIGN PATENT DOCUMENTS

JP 2001240471 A * 9/2001
JP 2019-31424 A 2/2019
(Continued)

OTHER PUBLICATIONS

Office Action issued Sep. 12, 2023 by the Japanese Patent Office in counterpart Japanese Patent Application No. 2022-549489.
(Continued)

*Primary Examiner* — William J Klimowicz
(74) *Attorney, Agent, or Firm* — Sughrue Mion, PLLC

(57) ABSTRACT

A lead-free piezoelectric ceramic composition includes a main phase containing an alkali niobate/tantalate perovskite oxide, and a subphase containing a spinel compound containing Ti (titanium). The piezoelectric ceramic composition contains Mn (manganese). A Ti content x is greater than 0 mol % and not greater than 4 mol %, and the Ti content x and an Mn content y satisfy an expression, x2/y≤20.0.

9 Claims, 1 Drawing Sheet

(52) U.S. Cl.
CPC ................. *C04B 2235/3234* (2013.01); *C04B 2235/3255* (2013.01); *C04B 2235/3262* (2013.01); *C04B 2235/763* (2013.01); *C04B 2235/768* (2013.01); *C04B 2235/85* (2013.01)

(56) References Cited

U.S. PATENT DOCUMENTS

| | | | | |
|---|---|---|---|---|
| 2016/0052826 | A1 | 2/2016 | Yamazaki et al. | |
| 2019/0044054 | A1* | 2/2019 | Watanabe | C04B 35/4682 |
| 2020/0169191 | A1* | 5/2020 | Kubota | C04B 35/495 |

FOREIGN PATENT DOCUMENTS

| | | | |
|---|---|---|---|
| JP | 2019031424 | A * | 2/2019 |
| WO | 2011/093021 | A1 | 8/2011 |
| WO | 2013/008418 | A1 | 1/2013 |
| WO | 2014/156015 | A1 | 10/2014 |

OTHER PUBLICATIONS

International Search Report (PCT/ISA/210) issued by the International Searching Authority on May 17, 2022 in corresponding International Application No. PCT/JP2022/016992.
Written Opinion (PCT/ISA/237) issued by the International Searching Authority on May 17, 2022 in corresponding International Application No. PCT/JP2022/016992.

* cited by examiner

LEAD-FREE PIEZOELECTRIC CERAMIC COMPOSITION AND PIEZOELECTRIC ELEMENT

CROSS REFERENCE TO RELATED APPLICATIONS

This application is a National Stage of International Application No. PCT/JP2022/016992 filed on Apr. 1, 2022 claiming priority from Japanese Patent Application No. 2021-065980 filed on Apr. 8, 2021.

TECHNICAL FIELD

The present disclosure relates to a lead-free piezoelectric ceramic composition and a piezoelectric element.

BACKGROUND ART

Many conventionally mass-produced piezoelectric ceramics are formed of PZT (lead zirconate titanate) materials and thus contain lead. However, in recent years, in order to eliminate an adverse effect of lead on the environment, development of lead-free piezoelectric ceramics has been desired. For example, a composition represented by compositional formula $ANbO_3$ (A represents an alkali metal) is proposed as a material of such a lead-free piezoelectric ceramic (called "lead-free piezoelectric ceramic composition"). However, an $ANbO_3$ lead-free piezoelectric ceramic composition itself involves a problem in that sinterability and resistance to humidity are poor.

In order to solve such a problem, each of the lead-free piezoelectric ceramic compositions of the following Patent Literatures 1 to 3 contains not only a main phase including a first crystalline phase formed of an $ANbO_3$ composition but also a subphase including a second crystalline phase formed of a spinel compound or the like.

CITATION LIST

Patent Literatures

Patent Literature 1: WO2014/156015
Patent Literature 2: WO2011/093021
Patent Literature 3: WO2013/008418

SUMMARY OF INVENTION

Technical Problem

Although the lead-free piezoelectric ceramic compositions of Patent Literatures 1 to 3 exhibit satisfactory sinterability and satisfactory piezoelectric constant (d33), they do not have sufficiently high mechanical quality factors (Qm) required for practical lead-free piezoelectric ceramic compositions. Thus, a lead-free piezoelectric ceramic composition which exhibits a high mechanical quality factor (Qm) is desired.

The present disclosure has been made in view of the above-described circumstances, and its object is to increase the mechanical quality factor (Qm) of a lead-free piezoelectric ceramic composition. The present disclosure can be realized in the following modes.

Solution to Problem

[1] A lead-free piezoelectric ceramic composition characterized by comprising:

a main phase containing an alkali niobate/tantalate perovskite oxide; and a subphase containing a spinel compound containing Ti (titanium), wherein the piezoelectric ceramic composition contains Mn (manganese), and wherein a Ti content x is greater than 0 mol % and not greater than 4 mol %, and the Ti content x and an Mn content y satisfy the following relational expression (1):

$$x^2/y \leq 20.0. \qquad \text{expression (1)}$$

[2] The lead-free piezoelectric ceramic composition as described in [1], wherein the Ti content x is greater than 0 mol % and not greater than 4 mol %, and the Ti content x and the Mn content y satisfy the following relational expression (2):

$$x^2/y \leq 8. \qquad \text{expression (2)}$$

[3] The lead-free piezoelectric ceramic composition as described in [2], wherein the Ti content x is greater than 0 mol % and not greater than 4 mol %, and the Ti content x and the Mn content y satisfy the following relational expression (3):

$$0.25 < x^2/y \leq 4. \qquad \text{expression (3)}$$

[4] The lead-free piezoelectric ceramic composition as described in any of [1] to [3], which has a sea-island structure in which the subphase forms islands and the main phase forms the sea.

[5] The lead-free piezoelectric ceramic composition as described in any of [1] to [4], wherein the Mn content is not less than 0.2 mol % and not greater than 5 mol %.

[6] The lead-free piezoelectric ceramic composition as described in any of [1] to [5], wherein the alkali niobate/tantalate perovskite oxide contained in the main phase contains at least one alkaline earth metal element.

[7] The lead-free piezoelectric ceramic composition as described in any of [1] to [6], wherein the alkali niobate/tantalate perovskite oxide contained in the main phase is an oxide represented by a compositional formula $(K_aNa_bLidA_d)_e(B_fC_g)O_h$, wherein element A includes at least one element selected from Ca (calcium), Sr (strontium), and Ba (barium); element B includes at least one element selected from Nb, Ta, Ti, Zr (zirconium), and Hf (hafnium), with at least Nb or Ta being essentially included; element C includes at least Mn and may include at least one element selected from Mg (magnesium), Fe (iron), Co (cobalt), and Zn (zinc); $a+b+c+d=1$, $a+b+c\neq0$, $0.80\leq e\leq1.10$, and $f+g=1$ are satisfied; and h is an arbitrary value for formation of a perovskite structure.

[8] The lead-free piezoelectric ceramic composition as described in any of [1] to [7], wherein the alkali niobate/tantalate perovskite oxide contained in the main phase is an alkali niobate perovskite oxide.

[9]A piezoelectric element characterized by comprising:
a piezoelectric ceramic formed of the lead-free piezoelectric ceramic composition as recited in any of [1] to [8]; and
electrodes attached to the piezoelectric ceramic.

Advantageous Effect of Invention

The lead-free piezoelectric ceramic composition of the present disclosure can exhibit an enhanced mechanical quality factor (Qm).

DESCRIPTION OF EMBODIMENTS

Figure 1:
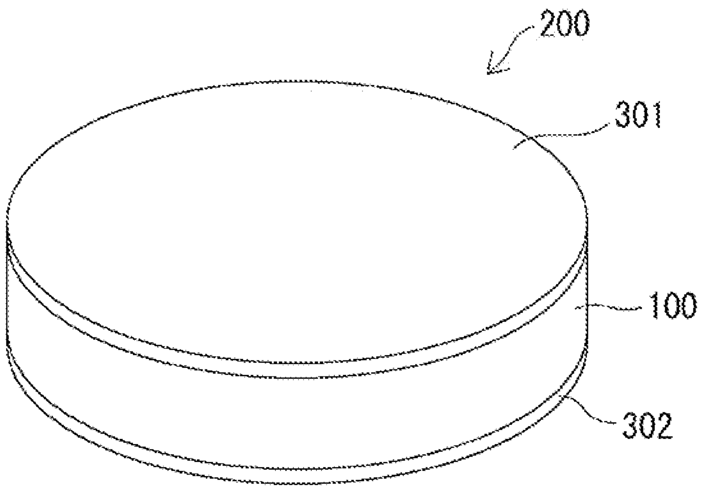
FIG. 1 is a perspective view showing a piezoelectric element which is one embodiment of the present disclosure.

The present disclosure will now be described in detail. Notably, in the present specification, any numerical range described using "to" includes a lower limit value and an upper limit value unless otherwise specified. For example, a description "10 to 20" should be read to include both "10" (lower limit value) and "20" (upper limit value). Namely, "10 to 20" has the same meaning as "10 or greater and 20 or less."

1. Lead-Free Piezoelectric Ceramic Composition

The lead-free piezoelectric ceramic composition (hereinafter, may be referred to simply as piezoelectric ceramic composition) of the present embodiment does not contain Pb (lead) and contains a main phase containing an alkali niobate/tantalate perovskite oxide, and a subphase containing a spinel compound containing Ti (titanium). The "alkali niobate/tantalate perovskite oxide" is defined as a perovskite-type oxide formed of at least one of alkali niobate perovskite oxide and alkali tantalate perovskite oxide. The term "spinel compound" encompasses both a normal spinel compound having a normal spinel type crystal structure and an inverse spinel compound having an inverse spinel type crystal structure. The piezoelectric ceramic composition contains Mn (manganese).

The Ti content x of the piezoelectric ceramic composition is greater than 0 mol % and not greater than 4 mol %, and the Ti content x and the Mn content y satisfy the following relational expression (1).

$$x^2/y \leq 20.0 \qquad \text{expression (1)}$$

Since a spinel compound containing Ti is contained in the subphase of the piezoelectric ceramic composition, sinterability is improved, and polarization occurs easier in the piezoelectric ceramic composition. Since the Ti content x is not greater than 4 mol %, incorporation of Mn into the main phase is facilitated, and the mechanical quality factor (Qm) of the piezoelectric ceramic composition can be increased. Meanwhile, when the Ti content x is greater than 4 mol %, the mechanical quality factor (Qm) of the piezoelectric ceramic composition lowers, because no substantial Ma cannot be contained in the main phase, but is mostly contained in the subphase.

Preferably, the Ti content x of the piezoelectric ceramic composition is greater than 0 mol % and not greater than 4 mol %, and the Ti content x and the Mn content y satisfy the following relational expression (2).

$$x^2/y \leq 8 \qquad \text{expression (2)}$$

By virtue of this, the piezoelectric ceramic composition can be polarized more easily and can have an increased mechanical quality factor (Qm).

More preferably, the Ti content x of the piezoelectric ceramic composition is greater than 0 mol % and not greater than 4 mol %, and the Ti content x and the Mn content y satisfy the following relational expression (3).

$$0.25 < x^2/y \leq 4 \qquad \text{expression (3)}$$

By virtue of this, the piezoelectric ceramic composition can be polarized more easily and can have a further increased mechanical quality factor (Qm).

From the viewpoint of forming the subphase containing a spinel compound for improving sinterability, the Ti content x of the piezoelectric ceramic composition is greater than 0 mol %, preferably 0.5 mol % or greater, more preferably 1.0 mol % or greater. From the viewpoint of incorporating Mn mostly into the main phase for enhancing the mechanical quality factor (Qm), the Ti content x of the piezoelectric ceramic composition is 4 mol % or less, preferably 3.5 mol % or less, more preferably, 3.0 mol % or less. From these viewpoints, the Ti content x of the piezoelectric ceramic composition is greater than 0 mol % and not greater than 4 mol %, preferably not less than 0.5 mol % and not greater than 3.5 mol %, more preferably not less than 1.0 mol % and not greater than 3.0 mol %.

From the viewpoint of incorporating Mn mostly into the main phase, thereby increasing the mechanical quality factor (Qm), the Mn content y of the piezoelectric ceramic composition is preferably 0.2 mol % or greater, more preferably 0.5 mol % or greater, further preferably 0.8 mol % or greater. From the viewpoint of suppressing leakage by Mn, the Mn content y of the piezoelectric ceramic composition is preferably 5 mol % or less.

From the viewpoint of incorporating Mn mostly into the main phase for enhancing the mechanical quality factor (Qm), the value of expression $x^2/y$ in relation to the Ti content x and Mn content y of the piezoelectric ceramic composition is greater than 0, preferably 0.2 or greater, more preferably 0.5 or greater. From the viewpoint of incorporating Mn mostly into the main phase for enhancing the mechanical quality factor (Qm), the value of expression $x^2/y$ is not greater than 20.0, preferably not greater than 18.0, more preferably not greater than 16.0. From these viewpoints, the value of $x^2/y$ is greater than 0 and not greater than 20.0, preferably not less than 0.2 and not greater than 18.0, more preferably not less than 0.5 and not greater than 16.0.

Preferably, the piezoelectric ceramic composition has a sea-island structure in which the subphase forms islands and the main phase forms the sea. In the sea-island structure, the subphase fills pores provided in the main phase. The subphase, which is mixedly present in the main phase, improves sinterability of the piezoelectric ceramic composition, improves structural stability, and improves piezoelectric properties.

(1) Main Phase

Preferably, the alkali niobate/tantalate perovskite oxide contained in the main phase contains at least one alkaline earth metal element. Examples of the alkaline earth metal include Ca (calcium), Sr (strontium), and Ba (barium).

Examples of preferred alkali niobate/tantalate perovskite oxides are represented by the following compositional formula (formula (2)).

$$(K_aNa_bLi_cA_d)d(B_fC_g)O_h \quad \text{formula (2)}$$

Element A includes at least one element selected from Ca, Sr, and Ba. Element B includes one or more elements selected from Nb, Ta, Ti, Zr (zirconium), and Hf (hafnium) and includes at least Nb or Ta. Element C includes at least Mn and may include at least one element selected from Mg (magnesium), Fe (iron), Co (cobalt), and Zn (zinc). Notably, value h is such an arbitrary value that the perovskite-type crystal structure is ensured. Namely, the amount of O atoms is controlled to maintain the perovskite-type crystal structure.

The element B in the above-described composition formula (2) will be described specifically. In the case where Nb is selected from Nb and Ta, the element B includes Nb and one or more elements selected from Ti, Zr, and Hf. Also, in the case where Ta is selected from Nb and Ta, the element B includes Ta and one or more elements selected from Ti, Zr, and Hf. Also, in the case where Nb and Ta are both selected, the element B includes Nb and Ta and one or more elements selected from Ti, Zr, and Hf.

The element C in the above-described compositional formula (2) will be described specifically. In the case where none of Mg, Fe, Co, and Zn is selected, the element C is Mn. Also, in the case where one or more elements are selected from Mg, Fe, Co, and Zn, the element C includes Mn and one or more elements selected from Mg, Fe, Co, and Zn.

From the viewpoint of improving the electrical properties of the piezoelectric ceramic composition, the piezoelectric properties of the piezoelectric ceramic composition, or the mechanical quality factor (Qm) of the piezoelectric ceramic composition, the respective element proportions in the above-described compositional formula (2) preferably fall within the following respective ranges:

$0.10 \le a \le 0.65$, $0.25 \le b \le 0.85$, $0.00 \le c \le 0.08$, $0.00 \le d \le 0.10$, $0.80 \le e \le 1.10$, $0.90 \le f \le 0.998$, and $0.002 \le g \le 0.10$. Coefficient h is an arbitrary value for ensuring the crystal structure of the perovskite oxide.

$$a+b+c+d=1$$

$$a+b+c \neq 0$$

$$f+g=1$$

The respective element ratios in the above-described compositional formula (2) more preferably fall within the following respective ranges:

$0.40 \le a \le 0.60$, $0.40 \le b \le 0.60$, $0.02 \le c \le 0.05$, $0.03 \le d \le 0.08$, $0.80 \le e \le 1.10$, $0.90 \le f \le 0.95$, and $0.01 \le g \le 0.05$. Coefficient h is an arbitrary value for ensuring the crystal structure of the perovskite oxide.

$$a+b+c+d=1$$

$$a+b+c \neq 0$$

$$f+g=1$$

The above-described compositional formula (2) can be transformed into the following compositional formula (3), in the case where the element A may include one to three elements and each of the elements B and C may include one to five elements.

$$(K_aNa_bLi_cCa_{d1}Sr_{d2}Ba_{d3})_e(Nb_{f1}Ta_{f2}Ti_{f3}Zr_{f4}Hf_{f5}Mg_{g1}Mn_{g2}Fe_{g3}Co_{g4}Zn_{g5})O_h \quad \text{formula (3)}$$

Formula (3) satisfies the following relational expressions.

$$d=d1+d2+d3$$

$$f=f1+f2+f3+f4+f5$$

$$g=g1+g2+g3+g4+g5$$

$$f1+f2 \neq 0$$

$$g2 \neq 0$$

Preferably, the respective compositional proportions of the elements contained in the elements A to C fall within the following ranges.

$0.00 \le d1 \le 0.05$, $0.00 \le d2 \le 0.05$, $0.00 \le d3 \le 0.05$, $0.90 \le f1 \le 0.95$, $0.00 \le f2 \le 0.05$, $0.005 \le f3 \le 0.04$, $0.000 \le f4 \le 0.005$, $0.000 \le f5 \le 0.005$, $0.000 \le g1 \le 0.005$, $0.002 \le g2 \le 0.05$, $0.000 \le g3 \le 0.005$, $0.000 \le g4 \le 0.005$, and $0.000 \le g5 \le 0.005$.

Preferably, the "alkali niobate/tantalate perovskite oxide" contained in the main phase is an alkali niobate perovskite oxide. In this case, there can be provided a piezoelectric ceramic composition whose Curie temperature is higher as compared to the case where the "alkali niobate/tantalate perovskite oxide" contained in the main phase is an alkali tantalate perovskite oxide.

(2) Subphase

Preferably, the subphase contains an M-Ti—O spinel compound. The element M is preferably a metal element having a valence of 1 to 4. The M-Ti—O spinel compound is preferably a spinel compound represented by the following compositional formula (4).

$$M_jTiO_k \quad \text{formula (4)}$$

Preferably, the element M is at least one element selected from Li (lithium), Mg, Mn, Fe, Co, Zr, and Hf.

2. Piezoelectric Element

FIG. 1 is a perspective view showing a piezoelectric element which is one embodiment of the present disclosure. This piezoelectric element 200 includes a piezoelectric ceramic 100 formed of the piezoelectric ceramic composition of the present disclosure, and electrodes 301 and 302. This piezoelectric element 200 is configured such that the electrodes 301 and 302 are attached to the upper and lower surfaces, respectively, of the disk-shaped piezoelectric ceramic 100. Notably, the piezoelectric element can have various shapes and structures other than those mentioned above.

3. Utilization of Lead-Free Piezoelectric Ceramic Composition and Piezoelectric Element The lead-free piezoelectric ceramic composition and the piezoelectric element according to embodiment of the present disclosure can be widely applied to detection of vibration, detection of pressure, oscillation, piezoelectric devices, etc. For example, they can be utilized in various types of apparatuses, such as piezoelectric filters, piezoelectric vibrators, piezoelectric transformers, piezoelectric ultrasonic transducers, piezoelectric gyro sensors, and knocking sensors. Also, they can be utilized in devices in which those apparatuses are used.

4. Method of Producing Piezoelectric Element

Figure 2:
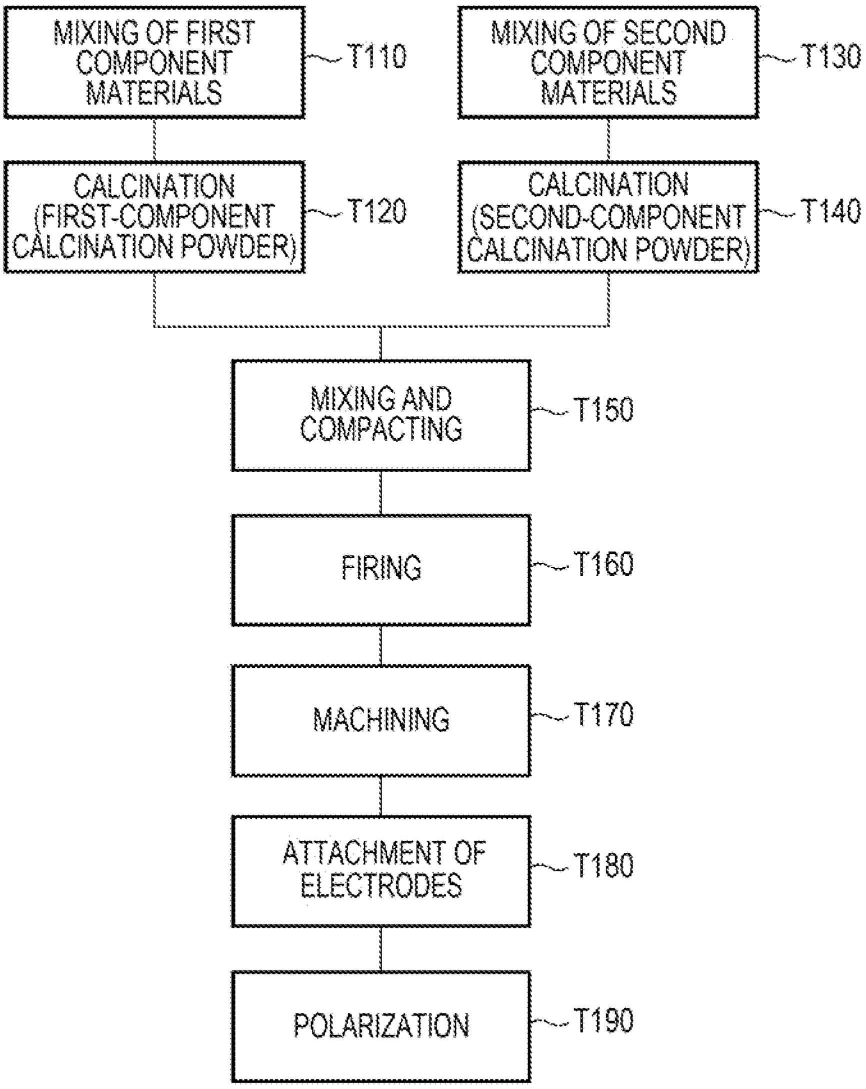
FIG. 2 is a flowchart showing a method of producing the piezoelectric element in the one embodiment of the present disclosure.

FIG. 2 is one example of a flowchart showing a method of producing the piezoelectric element in the one embodiment of the present disclosure. A first component and a second component which are prepared as described below are mixed together, whereby the main phase and the subphase are formed. The first component is the main component contained in the main phase. The second component differs from the components of the main phase.

In step T110, materials of the first component are mixed. In step T110, essential materials of the first component are selected from $K_2CO_3$ powder, $Na_2CO_3$ powder, $Li_2CO_3$ powder, $CaCO_3$ powder, $SrCO_3$ powder, $BaCO_3$ powder, $Nb_2O_5$ powder, $Ta_2O_5$ powder, $TiO_2$ powder, $ZrO_2$ powder, MgO powder, $Fe_2O_3$ powder, CoO powder, ZnO powder, etc. . . . and the selected materials are weighed according to values of coefficients a to h in the compositional formula (1) of the main phase described below.

$$(K_aNa_bLi_cA_d)_e(B_fC_g)O_h \quad \text{formula (1)}$$

Ethanol is added to these material powders. The material powders are wet-mixed in a ball mill, thereby yielding a slurry. Preferably, the wet-mixing in the ball mill is performed for 15 hours or longer. In step T120, mixed powder obtained by drying the slurry is calcined, for example, at a temperature of 600° C. to 1,100° C. in the atmosphere for one to 10 hours, thereby yielding calcination powder of the first-component.

In step T130, materials of the second component are mixed. Preferably, the composition of the second component is $K_{0.85}Ti_{0.85}Nb_{1.15}O_5$. Notably, the composition of the second component may be $KTiNbO_5$, $K_{0.90}Ti_{0.90}Nb_{1.10}O_5$, or the like. $K_2CO_3$ powder, $Nb_2O_5$ powder, and $TiO_2$ powder are selected as the materials of the second component and are weighed according to the values of the above-described compositional formula of the second component. Ethanol is added to these material powders. The material powders are wet-mixed in a ball mill, thereby yielding a slurry. Preferably, the wet-mixing in the ball mill is performed for 15 hours or longer. In step T140, mixed powder obtained by drying the slurry is calcined, for example, at a temperature of 600° C. to 1,100° C. in the atmosphere for one to 10 hours, thereby yielding calcination powder of the second-component.

In step T150, the first component, the second component, and an Mn species (for example, $MnCO_3$, MnO, $Mn_2O_3$, or $MnO_2$) are weighed. A dispersant, a binder, and ethanol are added thereto, and the resultant mixture is pulverized and mixed in a ball mill, thereby yielding a slurry. In the case where an additional metal is added, necessary materials are selected from CuO powder, $Fe_2O_3$ powder, ZnO powder, MgO powder, CoO powder, etc., and the selected materials are weighed and are mixed into the slurry. Notably, the obtained slurry may be calcinated again and then pulverized and mixed. Subsequently, the slurry is dried for granulation. The resultant granular substance is compacted into a desired shape, for example, through uniaxial pressing at a pressure of 20 MPa. Typical shapes of a piezoelectric ceramic suitable for the composition in the embodiment of the present disclosure are, for example, a disk-like shape and a circular columnar shape. Subsequently, the CIP (cold isostatic pressing) process is performed at a pressure of, for example, 150 Mpa, thereby yielding a green compact.

In step T160, the obtained green compact (CIP press-molded body) is fired at a temperature of, for example, 900° C. to 1,300° C. in the atmosphere for, for example, one to 10 hours, thereby yielding a piezoelectric ceramic. After firing, the second component reacts with the first component and Mn oxide, so that the subphase containing a spinel compound containing Ti is formed. The firing in step T160 may be performed in an $O_2$ atmosphere. Subsequently, in step T170, the piezoelectric ceramic is machined according to dimensional accuracy required for the piezoelectric element. In step T180, to the thus-yielded piezoelectric ceramic, electrodes are attached. In step T190, polarization is performed.

The above-described production method is one example, and various other steps and processing conditions for producing the piezoelectric element can be utilized. For example, as shown in FIG. 2, after producing the first component and the second component individually in advance, powders of the two components are mixed and fired. Alternatively, the piezoelectric ceramic composition may be produced by mixing together materials, including the first component and the second component, and firing the resultant mixture. However, since the production method of FIG. 2 facilitates strict management of the compositions of the first and second components, the yield of the piezoelectric ceramic composition can be increased.

EXAMPLES

The present invention will be described further specifically by way of example.

1. Preparation of Composition Samples

Various types of composition samples were prepared by appropriately choosing the types and amounts of materials of the first component and the second component. The composition samples have different Mn contents as a result of adjustment of the amount of the Mn species at the time of mixing the first component, the second component, and the Mn species (the above-described step T150). The composition samples have different Ti contents as a result of adjustment of the amount of Ti in the first component and the second component.

Tables 1 shows the Mn and Ti contents of each composition sample. In Table 1, each composition sample is denoted with "No." Sample Nos. 3, 4, and 6 to 10 are examples, and sample Nos. 1, 2, 5, and 11 to 13 are comparative examples. Hereinafter, the composition samples will be denoted by their sample Nos.

2. Identification of Spinel Compound

The spinel compound contained in each composition sample was identified by performing Rietveld analysis of the results of powder X-ray diffraction (XRD). A high-resolution device using a synchrotron radiation having a high intensity (wavelength: 0.7 angstrom) was used for measurement of X-ray diffraction.

3. Determination of Contained Ti

Each composition sample was analyzed by means of an electron probe micro analyzer (EPMA), thereby determining whether or not the subphase contains Ti. Notably, in the case where the grain size of the subphase was small, cross-sectional observation was performed under a transmission electron microscope (TEM-EDS), thereby determining whether or not the subphase contains Ti.

4. Evaluation of Electrical Properties

The mechanical quality factor (Qm) of each sample was obtained, by means of an impedance analyzer, on the basis of a resonance-antiresonance method.

5. Evaluation Results

Table 1 shows the evaluation results.

The presence/absence of subphase formation was evaluated as Formed or Not formed. The presence/absence of subphase formation was determined by identifying the spinel compound.

Accomplishment of polarization was evaluated as Accomplished or Not accomplished. Electrodes was attached to the piezoelectric ceramic piece and polarization was attempted.

TABLE 1

| Sample No. | Mn content y (mol %) | Ti content x (mol %) | $x^2/y$ | Formation of subphase | Polarization | Mechanical quality factor (Qm) |
|---|---|---|---|---|---|---|
| 1 | 0 | 0 | — | Not | Not | Measurement impossible |
| 2 | 0 | 2 | — | Formed | Accomplished | 85 |
| 3 | 0.2 | 2 | 20 | Formed | Accomplished | 220 |
| 4 | 0.5 | 2 | 8 | Formed | Accomplished | 255 |
| 5 | 1 | 0 | 0 | Not | Not | Measurement impossible |
| 6 | 1 | 0.5 | 0.25 | Formed | Accomplished | 283 |
| 7 | 1 | 1 | 1 | Formed | Accomplished | 328 |
| 8 | 1 | 2 | 4 | Formed | Accomplished | 306 |
| 9 | 5 | 2 | 0.8 | Formed | Accomplished | 450 |
| 10 | 1 | 4 | 16 | Formed | Accomplished | 201 |
| 11 | 1 | 4.5 | 20.25 | Formed | Accomplished | 100 |
| 12 | 0.5 | 4.5 | 40.5 | Formed | Accomplished | 80 |
| 13 | 0.5 | 4 | 32 | Formed | Accomplished | 92 |
| 14 | 3 | 2 | 1 | Formed | Accomplished | 420 |
| 15 | 3 | 3 | 3 | Formed | Accomplished | 324 |
| 16 | 3 | 4 | 5 | Formed | Accomplished | 281 |

(1) Whether or not Sample Nos. 1 to 16 Satisfy Requirements

Sample Nos. 3, 4, 6 to 10, and 14 to 16, which are examples, satisfy the following requirements (a), (b), and (c). Sample No. 1, which is a comparative example, fails to satisfy the following requirements (a), (b), and (c). Sample No. 2 fails to satisfy the following requirements (b) and (c). Sample No. 5 fails to satisfy the following requirements (a) and (c). Sample Nos. 11 to 13 fail to satisfy the following requirement (c).

Requirement (a): The composition has a subphase containing a spinel compound containing Ti.

Requirement (b): The composition contains Mn.

Requirement (c): The Ti content x is greater than 0 mol % and not greater than 4 mol %, and the Ti content x and the Mn content y satisfy the following relational expression (1).

$$x^2/y \leq 20.0 \quad \text{expression (1)}$$

Sample Nos. 4, 6 to 9, and 14 to 16, which are examples, satisfy the following requirement (d). Sample Nos. 3 and 10, which are examples, fail to satisfy the following requirement (d).

Requirement (d): The Ti content x is greater than 0 mol % and not greater than 4 mol %, and the Ti content x and the Mn content y satisfy the following relational expression (2).

$$x^2/y \leq 8 \quad \text{expression (2)}$$

Sample Nos. 6 to 9, 14, and 15, which are examples, satisfy the following requirement (e). Sample Nos. 4 and 16, which are examples, fail to satisfy the following requirement (e).

Requirement (e): The Ti content x is greater than 0 mol % and not greater than 4 mol %, and the Ti content x and the Mn content y satisfy the following relational expression (3).

$$0.25 < x^2/y \leq 4 \quad \text{expression (3)}$$

(2) Results and Discussion

Since sample Nos. 3, 4, 6 to 10, and 14 to 16 (examples) and Sample Nos. 2 and 11 to 13 (comparative examples) bad subphases and satisfied the requirement (a), they were able to be polarized. Since sample Nos. 1 and 5 (comparative examples) did not have subphases and failed to satisfy the requirement (a), they were not able to be polarized.

The mechanical quality factor (Qm) of sample No. 3 (example) was 220, and the mechanical quality factor (Qm) of sample No. 2 (comparative example) was 85. Sample No. 3 contains Mn and satisfies the requirement (b), and sample No. 2 does not contain Mn and fails to satisfy the requirement (b). Therefore, conceivably, in the case of sample No. 3, Mn is mostly contained in the main phase, unlike the case of sample No. 2, and therefore, the sample No. 3 had an increased mechanical quality factor (Qm).

The mechanical quality factors (Qm) of sample Nos. 3, 4, and 6 to 10 (examples) ranged from 201 to 450, and the mechanical quality factors (Qm) of sample Nos. 11 to 13 (comparative examples) ranged from 80 to 100. Conceivably, since sample Nos. 3, 4, and 6 to 10 satisfy the requirement (c), sinterability was improved, and these samples had increased densities, so that these samples were able to be polarized easily. In addition, incorporation of Mn into the main phase was facilitated, so that these samples had increased mechanical quality factors (Qm).

The mechanical quality factors (Qm) of sample Nos. 4, 6 to 9, and 14 to 16 (examples) ranged from 255 to 450, and the mechanical quality factors (Qm) of sample Nos. 3 and 10 (examples) were 220 and 210, respectively. Conceivably, since sample Nos. 4, 6 to 9, and 14 to 16 satisfy the requirement (d), these samples were able to be polarized more easily, and incorporation of Mn into the main phase was facilitated, so that these samples had more increased mechanical quality factors (Qm).

The mechanical quality factors (Qm) of sample Nos. 6 to 9, 14, and 15 (examples) ranged from 283 to 450, and the mechanical quality factors (Qm) of sample Nos. 4 and 16 (examples) were 255 and 281, respectively. Conceivably, since sample Nos. 6 to 9, 14, and 15 satisfy the requirement (e), these samples were able to be polarized further easily, and incorporation of Mn into the main phase was facilitated, so that these samples had further increased mechanical quality factors (Qm).

6. Effects of Examples

The lead-free piezoelectric ceramic compositions of the present examples were able to have increased mechanical quality factors (Qm).

The present disclosure is not limited to the embodiment described in detail above, and various modifications and changes are possible.

REFERENCE SIGNS LIST

100: piezoelectric ceramic
200: piezoelectric element
301, 302: electrode

The invention claimed is:

1. A lead-free piezoelectric ceramic composition characterized by comprising:

a main phase containing an alkali niobate/tantalate perovskite oxide; and a subphase containing a spinel compound containing Ti (titanium), wherein the piezoelectric ceramic composition contains Mn (manganese), and wherein a Ti content x is greater than 0 mol % and not greater than 4 mol %, and the Ti content x and an Mn content y satisfy the following relational expression (1):

$$x^2/y \leq 20.0. \qquad \text{expression (1)}$$

2. A lead-free piezoelectric ceramic composition as set forth in claim 1, wherein the Ti content x is greater than 0 mol % and not greater than 4 mol %, and the Ti content x and the Mn content y satisfy the following relational expression (2):

$$x^2/y \leq 8. \qquad \text{expression (2)}$$

3. A lead-free piezoelectric ceramic composition as set forth in claim 2, wherein the Ti content x is greater than 0 mol % and not greater than 4 mol %, and the Ti content x and the Mn content y satisfy the following relational expression (3):

$$0.25 < x^2/y \leq 4. \qquad \text{expression (3)}$$

4. A lead-free piezoelectric ceramic composition as set forth in claim 1, which has a sea-island structure in which the subphase forms islands and the main phase forms the sea.

5. A lead-free piezoelectric ceramic composition as set forth in claim 1, wherein the Mn content is not less than 0.2 mol % and not greater than 5 mol %.

6. A lead-free piezoelectric ceramic composition as set forth in claim 1, wherein the alkali niobate/tantalate perovskite oxide contained in the main phase contains at least one alkaline earth metal element.

7. A lead-free piezoelectric ceramic composition as set forth in claim 1, wherein the alkali niobate/tantalate perovskite oxide contained in the main phase is an oxide represented by a compositional formula $(K_aNa_bLi_cA_d)_e(B_fC_g)O_h$, wherein element A includes at least one element selected from Ca (calcium), Sr (strontium), and Ba (barium); element B includes at least one element selected from Nb, Ta, Ti, Zr (zirconium), and Hf (hafnium), with at least Nb or Ta being essentially included; element C includes at least Mn and may include at least one element selected from Mg (magnesium), Fe (iron), Co (cobalt), and Zn (zinc); a+b+c+d=1, a+b+c≠0, 0.80≤e≤1.10, and f+g=1 are satisfied; and h is an arbitrary value for formation of a perovskite structure.

8. A lead-free piezoelectric ceramic composition as set forth in claim 1, wherein the alkali niobate/tantalate perovskite oxide contained in the main phase is an alkali niobate perovskite oxide.

9. A piezoelectric element characterized by comprising:

a piezoelectric ceramic formed of the lead-free piezoelectric ceramic composition as recited in claim 1; and electrodes attached to the piezoelectric ceramic.

* * * * *